(12) United States Patent
Yang et al.

(10) Patent No.: US 8,879,300 B2
(45) Date of Patent: Nov. 4, 2014

(54) SWITCHABLE TWO-TERMINAL DEVICES WITH DIFFUSION/DRIFT SPECIES

(75) Inventors: Jianhua Yang, Palo Alto, CA (US); Wei Wu, Palo Alto, CA (US); Qiangfei Xia, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 96 days.

(21) Appl. No.: 13/384,853

(22) PCT Filed: Apr. 22, 2010

(86) PCT No.: PCT/US2010/032071
§ 371 (c)(1),
(2), (4) Date: Jan. 19, 2012

(87) PCT Pub. No.: WO2011/133158
PCT Pub. Date: Oct. 27, 2011

(65) Prior Publication Data
US 2013/0051121 A1    Feb. 28, 2013

(51) Int. Cl.
*G11C 11/00* (2006.01)
*H01L 45/00* (2006.01)
*B82Y 10/00* (2011.01)
*H01L 27/102* (2006.01)

(52) U.S. Cl.
CPC ............... *B82Y 10/00* (2013.01); *H01L 45/08* (2013.01); *H01L 27/1021* (2013.01)
USPC ................... 365/148; 365/175; 257/4; 257/5; 257/E45.002

(58) Field of Classification Search
CPC ....... G11C 11/21; H01L 45/00; H01L 29/417
USPC ................ 365/148, 175; 257/4, 5, 45.002 E, 257/E54.002
See application file for complete search history.

(56) References Cited

U.S. PATENT DOCUMENTS

| 5,801,417 | A | 9/1998 | Tsang |
| 6,043,516 | A | 3/2000 | Schulze |
| 7,087,920 | B1 | 8/2006 | Kamins |
| 7,382,647 | B1 | 6/2008 | Gopalakrishnan |
| 8,063,395 | B2 * | 11/2011 | Xia et al. ............. 257/4 |
| 2007/0274120 | A1 | 11/2007 | Pinnow et al. |
| 2008/0304307 | A1 | 12/2008 | Gopalakrishnan |
| 2009/0014707 | A1 | 1/2009 | Lu et al. |
| 2009/0323391 | A1 | 12/2009 | Scheuerlein et al. |
| 2011/0240952 | A1 * | 10/2011 | Yang et al. ............. 257/5 |

FOREIGN PATENT DOCUMENTS

| WO | WO-2009140305 | 11/2009 |
| WO | WO-2010014064 | 2/2010 |

OTHER PUBLICATIONS

Electronic Materials Conference 2009 Final Program.

* cited by examiner

*Primary Examiner* — Toan Le

(57) ABSTRACT

Various embodiments of the present invention are directed to nanoscale electronic devices that provide nonvolatile memristive switching. In one aspect, a two-terminal device (600) comprises a first electrode (602), a second electrode (604), and an active region (606) disposed between the first electrode and the second electrode. The active region includes a mobile dopant (608), and a fast drift ionic species (610). The fast drift ionic species drifts into a diode-like electrode/active region interface temporarily increasing conductance across the interface when a write voltage is applied to the two-terminal device to switch the device conductance.

15 Claims, 9 Drawing Sheets

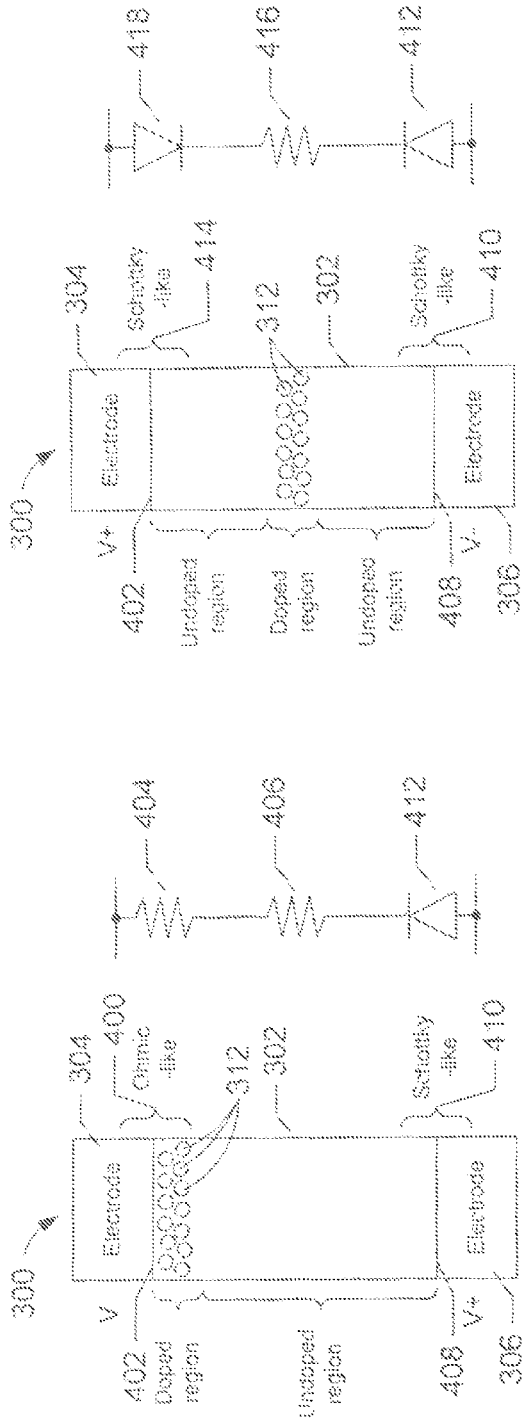
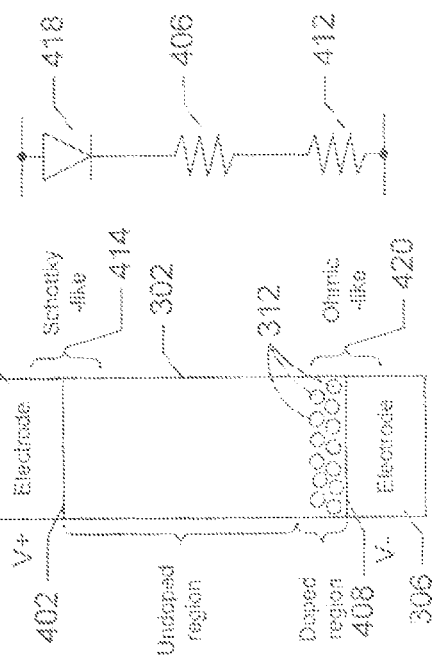
FIGURE 4A
FIGURE 4B
FIGURE 4C

SWITCHABLE TWO-TERMINAL DEVICES WITH DIFFUSION/DRIFT SPECIES

TECHNICAL FIELD

Embodiments of the present invention are related to nanoscale memristor devices, and, in particular, to re-configurable memristors that can be implemented in crossbar arrays.

BACKGROUND

Significant research and development efforts are currently directed towards designing and manufacturing nanoscale electronic devices, such as nanoscale memories. Nanoscale electronics promises significant advances, including significantly reduced features sizes and the potential for self-assembly and for other relatively inexpensive, non-photolithography-based fabrication methods. However, the design and manufacture of nanoscale electronic devices present many new problems compared with the current state-of-the-art.

Studies of switching in nanometer-scale transition-metal devices have previously reported that these devices could be reversibly switched and had an "on-to-off" conductance ratio of $>10^3$. These devices have been used to construct crossbar circuits and provide a promising route for the creation of ultra-high density non-volatile memory. A series connection of crossbar switches that can be used to fabricate, for example, latch circuit elements has also been demonstrated, which is an important component for logic circuits and for communication between logic and memory. New logic families that can be constructed entirely from crossbar arrays of resistive switches or as hybrid structures, composed of resistive switches and transistors have been described. These new logic families have the potential to dramatically increase the computing efficiency of CMOS circuits, thereby enabling performance improvements of orders of magnitude without having to shrink transistors, or to even replace CMOS for some applications if necessary. However, it is desired to improve the performance of the devices that are presently fabricated.

BRIEF DESCRIPTION OF THE DRAWINGS

FIGS. 4A-4C show schematic representations and associated circuit diagrams of a two-terminal device in various idealized conductance states in, accordance with one or more embodiments of the present invention.

DETAILED DESCRIPTION

Various embodiments of the present invention are directed to nanoscale electronic devices that provide nonvolatile memristive switching. The nanoscale electronic devices are configured with fast drift ionic species to prevent breakdown along diode-like interfaces when write, or programming, voltages are applied.

I. Nanowire Crossbars

Figure 1:
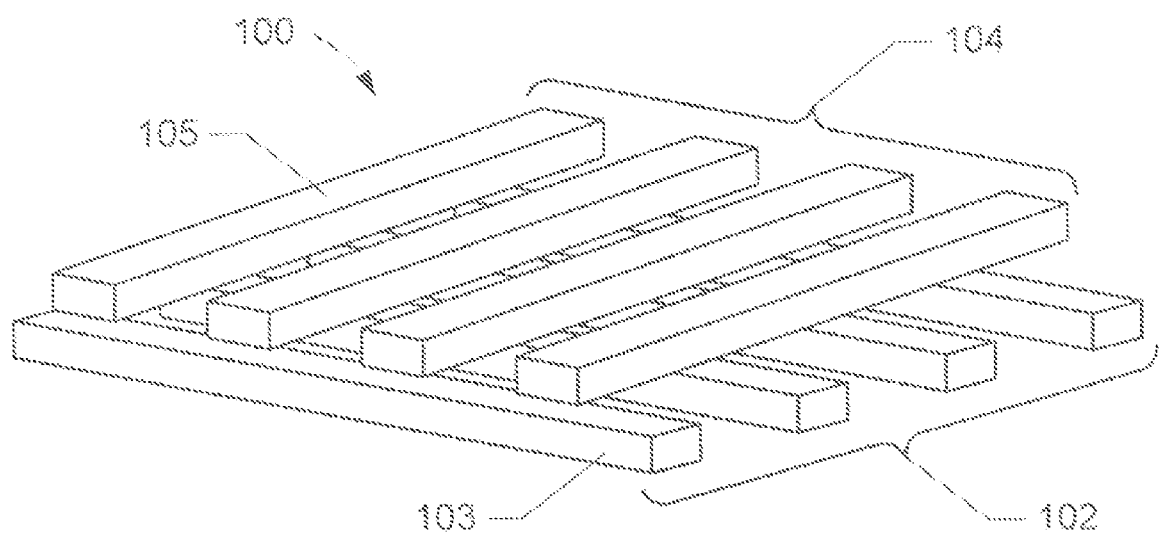
FIG. 1 shows an isometric view of an example nanowire crossbar array configured in accordance with one or more embodiments of the present invention.

FIG. 1 shows an isometric view of an example nanowire crossbar array 100. The crossbar array 100 is composed of a first layer 102 of approximately parallel nanowires 103 that are overlain by a second layer 104 of approximately parallel nanowires 105. The nanowires of the second layer 104 are approximately perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102 at nanowire intersections that represent the closest contact between two nanowires.

Although individual nanowires in FIG. 1 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

The layers can be fabricated by mechanical nanoimprinting techniques. Alternatively, nanowires can be chemically synthesized and can be deposited as layers of approximately parallel nanowires in one or more processing steps, including Langmuir-Blodgett processes. Other alternative techniques for fabricating nanowires may also be employed. Thus, a two-layer nanowire crossbar comprising first and second layers, as shown in FIG. 1, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

At nanowire intersections, nanoscale electronic components, such as diodes, and other familiar basic electronic components, can be fabricated to interconnect two overlapping nanowires. Any two nanowires connected by a device is called a "crossbar junction."

Figure 2:
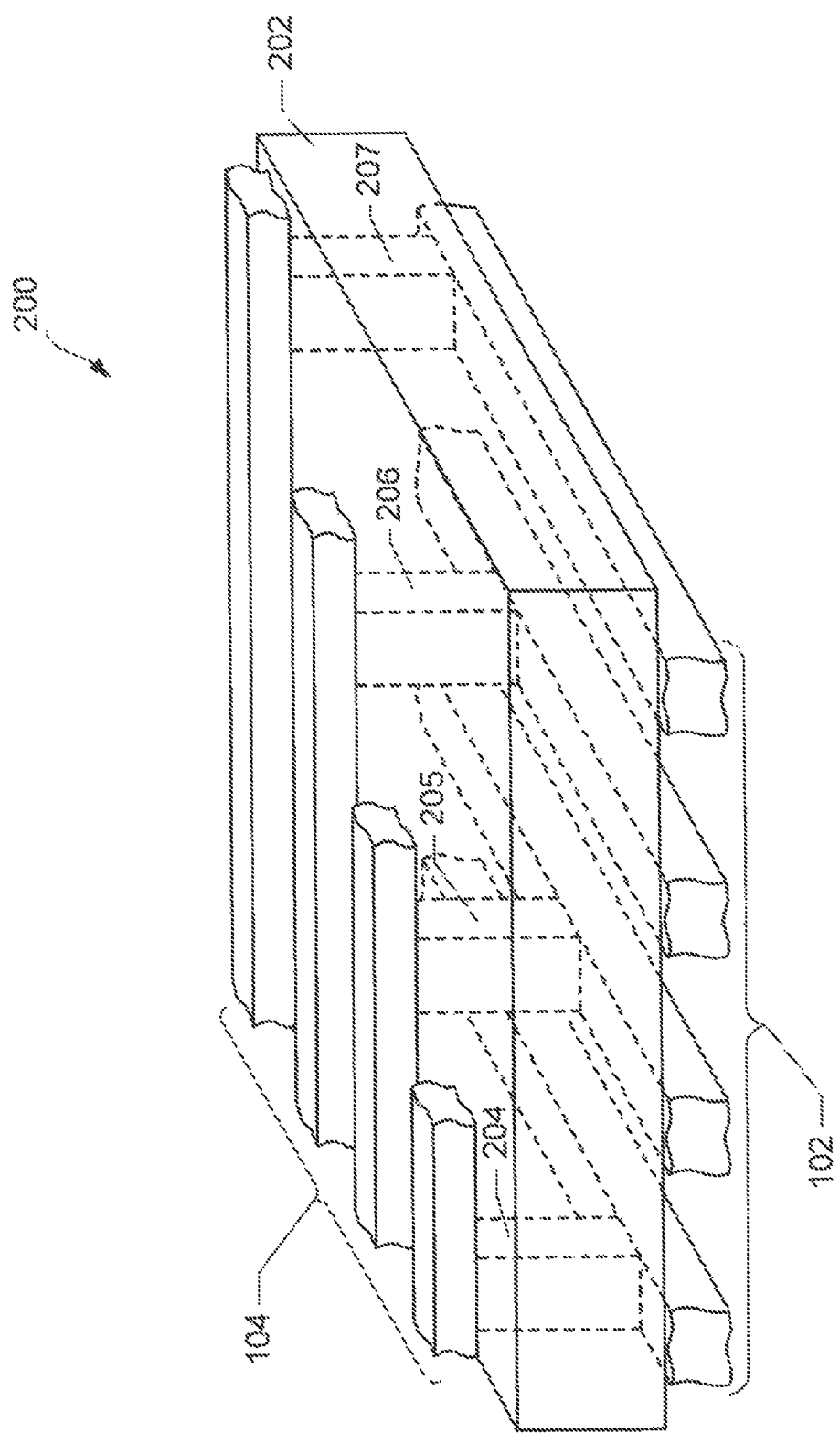
FIG. 2 shows an isometric view of a nanowire crossbar revealing an intermediate layer disposed between a two layers of approximately parallel nanowires in accordance with one or more embodiments of the present invention.

FIG. 2 shows an isometric view of a nanowire crossbar 200 revealing an intermediate layer 202 disposed between the first layer 102 of approximately parallel nanowires and the second layer 104 of approximately parallel nanowires. A portion, or region, of the intermediate layer 202 is disposed between intersecting nanowires forming a crossbar junction. For example, regions 204-209 of intermediate layer 202 material disposed between intersecting nanowires each form a crossbar junction. The regions 204-209 between intersecting nanowires, also called "active regions," can be configured to perform different functions including providing programmable switching between nanowires in the first layer 102 and nanowires in the second layer 104. Each nanowire in the first layer 102 of nanowires intersects every nanowire in the second layer 104 of nanowires through an associated active region, enabling each nanowire in the first layer 102 to be electronically connected to every nanowire in the second layer 104.

The nanowire crossbar 200 can be used to form a nonvolatile memory array. Each crossbar junction can be used to represent one or more bits of data. For example, a crossbar junction can be configured to operate in two states: a low-conductance state and a high-conductance state. The high-conductance state can represent a logic bit value "1" and a low-conductance state can represent a logic bit value "0," or vice versa. Binary data can be written into each crossbar junction of the nanowire crossbar 200 by changing the conductance state of the associated active region. The logic value encoded in the conductance state of a crossbar junction can be read by applying a read, or sense, voltage to one of the crossbar junction nanowires, such as a first layer 102 nanowire, and measuring the voltage or current on the other nanowire, such as a second layer 104 nanowire.

II. Two-Terminal Devices

Figure 3A:
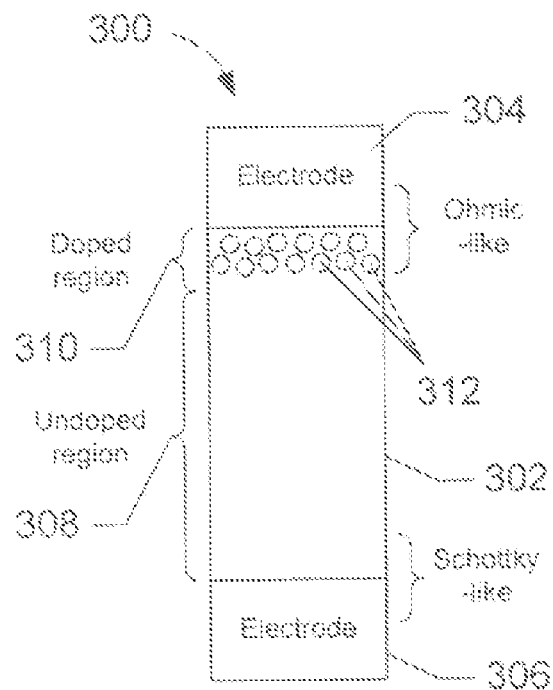
FIGS. 3A-3B show a schematic representation of a two-terminal device comprising an active region disposed between a first electrode and a second electrode in two conductance states in accordance with one or more embodiments of the present invention.

A crossbar junction of crossbar array is a type of more general two-terminal device. FIG. 3A shows a schematic representation of a two-terminal device 300 comprising an active region 302 disposed between a first electrode 304 and a second electrode 306. In certain embodiments, the electrodes 304 and 306 can be first layer 102 and second layer 104 nanowires, respectively. In other embodiments, the electrodes 304 and 306 can be separate elements that are connected to first layer 102 and second layer 104 nanowires. The active region 302 is composed of an undoped region 308 and a doped region 310. The undoped region 308 comprises a thin film of a material that can be a dielectric, electronically semiconducting, nominally electronically insulating and can also be a weak ionic conductor. The material comprising the active region 302 is capable of transporting and hosting ions that act as dopants in order to control the flow of electrons or current (i.e., conductivity) through the device 300. On the other hand, the doped region 310 is composed of mobile dopants 312 that, in certain embodiments, may be impurity atoms that act as electron donors. Alternatively, in other embodiments, the mobile dopants 312 can be anion vacancies, which in the active region 302, are charged and therefore are also electron donors. In still other embodiments, the doped region 310 is composed of mobile dopants 312 that may be impurity atoms that act as electron acceptors. Properties and composition of the active region 302 is described in greater detail below in subsection III.

The terms "doped" and "undoped" are used to indicate relative levels of dopants or other impurities that may be present in the active region 302. In particular, the term "undoped" does not mean total absence of the dopants from the undoped region. Rather, the term "undoped" simply means that there are fewer dopants in the undoped region than there are in the doped region. As a result, the undoped region has a lower conductivity than the doped region.

Figure 3B:
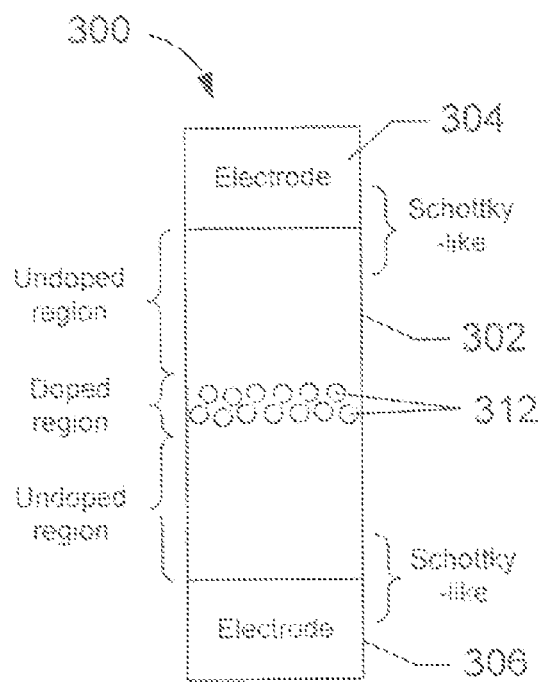

The device 300 can be operated by applying appropriate voltages to the electrodes 304 and 306 to create an electric field of an appropriate magnitude and polarity across the active region 302. When the magnitude and polarity of the electric field, also called a "drift field," exceeds a threshold, the dopants 312 become mobile in the active region 302 and can drift via ionic transport. The dopants 312 are specifically chosen to operate as electron acceptors or electron donors for the active region 302, and thereby change the resistance of the active region 302 material. FIG. 3B shows an example of the dopants 312 driven deeper into the active region 302 after applying an appropriate drift field. Driving the dopants 312 away from the electrode 304 decreases the conductance of the active region 302 near the electrode 304, while applying a drift field that drives the dopants 312 toward the electrode 304, as shown in FIG. 3A, increases the conductance of the active region 302 near the electrode 304.

Positioning the dopant 312 within the active region 302 determines whether Ohmic-like and/or Schottky-like barriers are formed at electrode/active region interfaces. The kind of Ohmic-like or Schottky-like barrier formed at the interface controls the flow of charge carriers (i.e., electrons and holes) through the active region 302. However, the traditional description of Schottky and Ohmic barriers may not apply to a nanoscale device 300 because the materials comprising the electrodes 304 and 306 and the active region 302 are on the nanometer scale. As a result, structural and electronic properties are not averaged over for which the theory of metal-semiconductor contacts is developed. The electronic properties of undoped electrode/active region interfaces can electronically resemble larger dimension Schottky barriers and are called "Schottky-like barriers," and the electronic properties of doped electrode/active region interfaces electronically resemble Ohmic barriers and are called "Ohmic-like barriers."

Applying a voltage across a crossbar junction to read the conductance state of the crossbar junction creates a forward bias across one interface and a reverse bias across the other interface. The terms "forward bias" and "reverse bias" are relative terms. A forward bias refers operating an electrode as an anode through which electron current flows into the active region. A reverse bias, on the other hand, refers to operating an electrode as a cathode through which electron current flows out of the active region.

As shown in FIGS. 3A-3B, the mobile dopants 312 can be selectively positioned within the active region 302 to control the flow of charge carriers, or electron current, through the device 300. An Ohmic-like barrier creates a relatively low resistance and has substantially no tendency to rectify an electron current. Conduction of electrons across the Ohmic-like barrier occurs whether the voltage across the interface is applied as a forward bias or a reverse bias. By contrast, a Schottky-like barrier has diode-like properties. Conduction of electrons across the Schottky-like barrier depends on whether the voltage across the interface is applied as a forward bias or a reverse bias. A forward bias applied to a Schottky-like barrier formed at an interface enables electron current to flow from an electrode into the active region through the interface via thermal emission. An electron transport phenomenon called "tunneling" may also occur in some cases, which is also affected by the electronic barrier height and width. On the other hand, a reverse bias applied to a Schottky-like barrier formed at an interface blocks the flow of electron current from the active region into the electrode at the interface. In summary, a Schottky-like barrier has diode-like rectifying properties.

FIGS. 4A-4C show schematic representations and associated circuit diagrams of the device 300 in various idealized conductance states. In the following description, for the sake of simplicity, it is assumed that the mobile dopants 312 are positively charged and attracted to negative biased electrode and repelled by positive biased electrode. Note that embodiments of the present invention are intended not to be so limiting. It is recognized that, in practice, the dopants 312 can be either negatively charged or positively charges. Initially, as shown in the example of FIG. 4A, the mobile dopants 312 are positioned within the active region 302 close to the first electrode 304 forming an Ohmic-like barrier 400 at interface 402. FIG. 4A also includes a schematic circuit diagram characterizing the electronic properties of the device 300 using circuit symbols. The Ohmic-like barrier 400 is characterized as a resistor 404, and the undoped portion of the active region 302 is also characterized as a resistor 406. At interface 408 a Schottky-like barrier 410 having diode-like rectifying properties is characterized as a diode 412. The mobile dopants 312 are fixed when a read voltage is applied to the electrodes 304 and 306. The read voltage corresponds to operating the electrode 306 as an anode and the electrode 304 as a cathode creating a forward bias across the Schottky-like barrier 410. As a result, electron current can flow from the electrode 306 through the Schottky-like barrier 410, the active region 302, and the Ohmic-like barrier 400 and out through the electrode 304, and the device 300 represented in FIG. 4A is said to be in a high-conductance state.

The mobile dopants 312 can drift away from the first electrode 304 when an appropriate write, or programming, voltage is applied. The write voltage can be in the form of voltage pulse comprising a positive voltage applied to the first electrode 304 and/or a negative voltage applied to the second electrode 306. FIG. 4B shows the device 300 with the mobile dopants 312 located near the center of the active region 302. As a result, two Schottky-like barriers 410 and 414 corresponding to head-to-head diodes are formed at the interfaces 408 and 402. FIG. 4B also includes a schematic circuit diagram. The dopants 312 located near the center of the active region are characterized as a high conductance resistor 416, and the two Schottky-like barriers formed at the interfaces 402 and 408 are characterized as head-to-head diodes 418 and 412, respectively.

The state represented in FIG. 4B is a low or non-conductive state. When a read voltage is applied with either polarity no substantial amount of current can flow through the device 300. For example, applying a read voltage with the electrode 304 operated as anode and the electrode 306 operated as cathode, a forward bias is created across the interface 402, enabling electron current to pass through the Schottky-like barrier 414 and into the active region 302. However, a reverse bias is created at the interface 408. A reverse bias across the Schottky-like barrier 410 effectively blocks the electron current from flowing through the device 300. For the same reasons, a read voltage applied with the opposite polarity is blocked by the Schottky-like barrier 414.

The mobile dopants 312 remain in substantially the same distribution, shown in FIG. 4B, until a second write voltage is applied, which creates a drift field causing the dopants 312 to drift toward the second electrode 306. In FIG. 4C, the mobile dopants 312 are located in the active region 302 near the second electrode 306. An Ohmic-like barrier 420 is created at the interface 408. FIG. 4C includes a schematic circuit diagram. The Ohmic-like barrier 420 is characterized as a high conductance resistor 422 and the undoped portion of the active region 302 is also characterized by the resistor 406. Under a read voltage where the electrode 304 is operated as an anode and the electrode 306 is operated as cathode, electron current can flow from the electrode 304 through the Schottky-like barrier 414, the active region 302, and the Ohmic-like barrier 420 and out through the electrode 306, and the device 300 represented in FIG. 4C is also said to be in a high-conductance state.

III. Two-Terminal Device Properties

The active region 302 material and the dopants 312 are chosen so dopant drift within the active region 302 is possible but not too facile that dopants can diffuse into or out of different regions of the active region 302 material when no voltage is applied, in order to ensure that the active region 302 remains in a particular conductance state for a reasonable period of time, perhaps for many years at room temperature. The active region 302 is non-volatile because the active region 302 retains its conductance state even after the drift field has been removed. Applying a drift field with a large enough magnitude causes both electron current and dopants to drift, whereas applying operating voltages with lower relative voltage magnitudes than the drift field causes negligible dopant drift enabling the device to retain its rectifying state during reading of the conductance state, giving the crossbar junction desired memristor properties.

The term "memristor" is short for "memory resistor." Memristors are a class of passive two-terminal circuit elements that maintain a functional relationship between the time integrals of current and voltage. This results in resistance varying according to the device's memristance function. Specifically engineered memristors provide controllable resistance useful for switching current. The memristor is a special case in so-called "memristive systems," described as a class of mathematical models useful for certain empirically observed phenomena, such as the firing of neurons. The definition of the memristor is based solely on fundamental circuit variables, similar to the resistor, capacitor, and inductor. However, the necessarily nonlinear memristors may be described by any of a variety of time-varying functions. As a result, memristors do not belong to Linear Time-Independent circuit models. A linear time-independent memristor is simply a conventional resistor.

The active region 302 material can be nanocrystalline, nanoporous, or amorphous. The mobility of the dopants 312 in such nanostructured materials is much higher than in bulk crystalline material, since drift can occur through grain boundaries, pores or through local structural imperfections in a nanocrystalline, nanoporous, or amorphous material. Also, because the active region 302 material is relatively thin and the electric field could be very large, the amount of time needed for dopants to drift in the active region 302 rapidly changes the conductivity of the active region 302. Note that the dopant drift speed typically increases exponentially with the increasing magnitude of the electric field. For example, the time needed for a drift process varies approximately as the square of the distance the dopants 312 traveled, so the time to drift one nanometer is approximately one-millionth of the time to drift one micrometer.

As shown in FIGS. 3A-3B, the active region 302 is contacted on either side by metal electrodes 304 and 306, or one of the electrodes can be composed of a heavily doped semiconductor material and the other a metal. When the active region 302 is composed of a semiconductor material, the contact between a metal electrode and the active region 302 depletes the active region 302 of free charge carriers. Thus, the net charge of the active region 302 depends on the identity of the dopant 312 which is positive in the case of electron donors and negative in the case of electron acceptors.

One of many potentially useful properties of the active region 302 is that it can be a weak ionic conductor. The definition of the term "weak ionic conductor" depends on the application for which the crossbar junction 302 is designed.

In general, the mobility $\mu_d$ and the diffusion constant D for a mobile dopant 302 in a lattice are related by the Einstein equation:

$$D = \mu_d kT$$

where k is Boltzmann's constant, and T is absolute temperature. Thus, if the mobility $\mu_d$ of a dopant 312 in a lattice is high so is the diffusion constant D. In general, it is desired for the active region 302 to maintain a particular rectifying state for an amount of time that may range from a fraction of a second to years, depending on the application. Thus, it is desired that the diffusion constant D be low enough to ensure a desired level of stability, in order to avoid inadvertently turning the active region 302 from one rectifier to another rectifier via ionized dopant diffusion, rather than by intentionally setting the conductance state of the active region 302 with an appropriate voltage. Therefore, a weak ionic conductor is one in which the dopant mobility $\mu_d$ and the diffusion constant D are small enough to ensure the stability or non-volatility of the active region 302 for as long as necessary under the desired conditions. On the other hand, strong ionic conductors would have relatively larger dopant mobilities and be unstable against diffusion.

IV. Preventing Leakage Currents in Crossbar Arrays

Figure 5A:
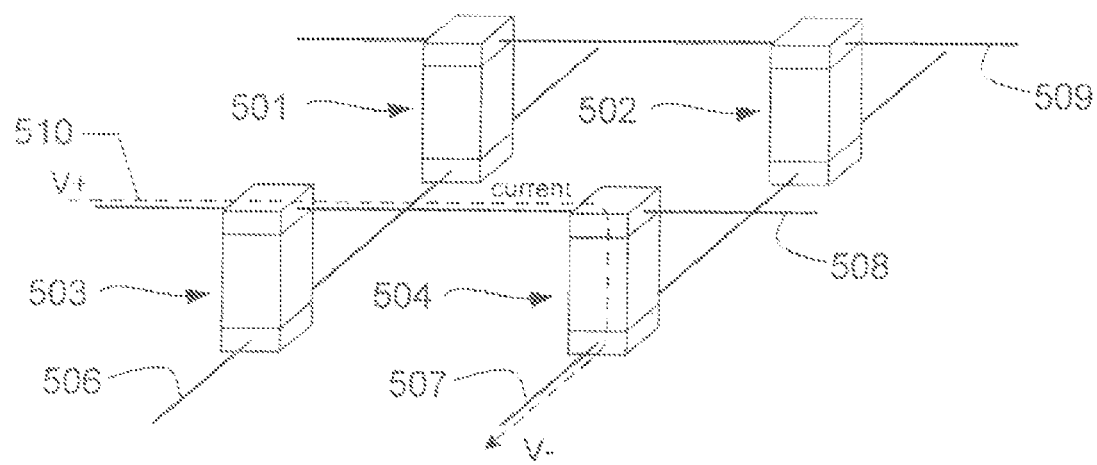
FIGS. 5A-5C show ideal and less than ideal operation of four two-terminal devices operated in accordance with one or more embodiments of the present invention.

FIG. 5A shows a schematic representation of four crossbar junctions 501-504 of a crossbar array. The crossbar junctions 501-504 are two-terminal devices that are configured to operate as described above in subsections II and III. The nanowires 506-509 extending between and beyond the crossbar junctions 501-504 are represented by lines with nanowires 506 and 507 in a first layer of nanowires and nanowires 508 and 509 in a second layer of nanowires. In order to read the conductance state of a particular crossbar junction, read voltages are applied to the corresponding intersecting nanowires. For example, as shown in FIG. 5A, in order to read the conductance state of the crossbar junction 504, a negative voltage is applied to the nanowire 508 and a positive voltage is applied to the nanowire 507 creating an electron current, represented by a dashed line, that flows from the nanowire 508 through the crossbar junction 504 and out along the nanowire 507. Reading circuitry, such as a sensing circuit, measures the current on the nanowire 507. When the current is above a certain threshold, the crossbar junction 504 is said to be in a high-conductance state, and the mobile dopants of the crossbar junction 504 are positioned as shown in FIGS. 4A and 4C. When the current is below the threshold, the crossbar junction 504 is said to be in a low or no conductance state, and the mobile dopants of the crossbar junction are positioned as shown in FIG. 4B.

However, if the crossbar junctions 501-504 are purely resistive in nature, a number of leakage currents can also travel through other paths. These leakage currents can be thought of as "electrical noise" which can even give rise to "sneak path currents" that obscure the reading of a crossbar junction conductance state.

Figure 5B:
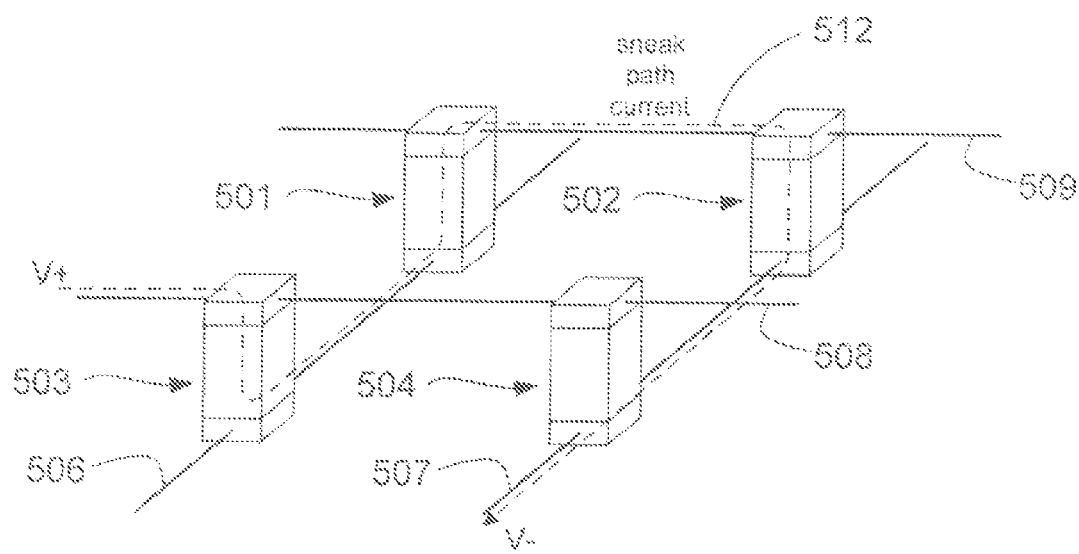

FIG. 5B shows an example of a sneak path current 512 that travels an alternative path from the nanowire 508 to the nanowire 507 when compared to the desired path taken by the current 510, shown in FIG. 5A. As shown in the example of FIG. 5B, in attempting to read the conductance state of the crossbar junction 504, a sneak path current is created that travels from nanowire 508 to nanowire 507 via three crossbar junctions 503, 501, and 502 instead of passing through the crossbar junction 504. The reading circuitry attached to the nanowire 507 would likely give an incorrect conductive state for the crossbar junction 504. It can be imagined that for larger crossbar arrays, a number of different leakage currents can give undesirable currents on output nanowires, which makes the actual conductance state of a crossbar junction undetermined.

Figure 5C:
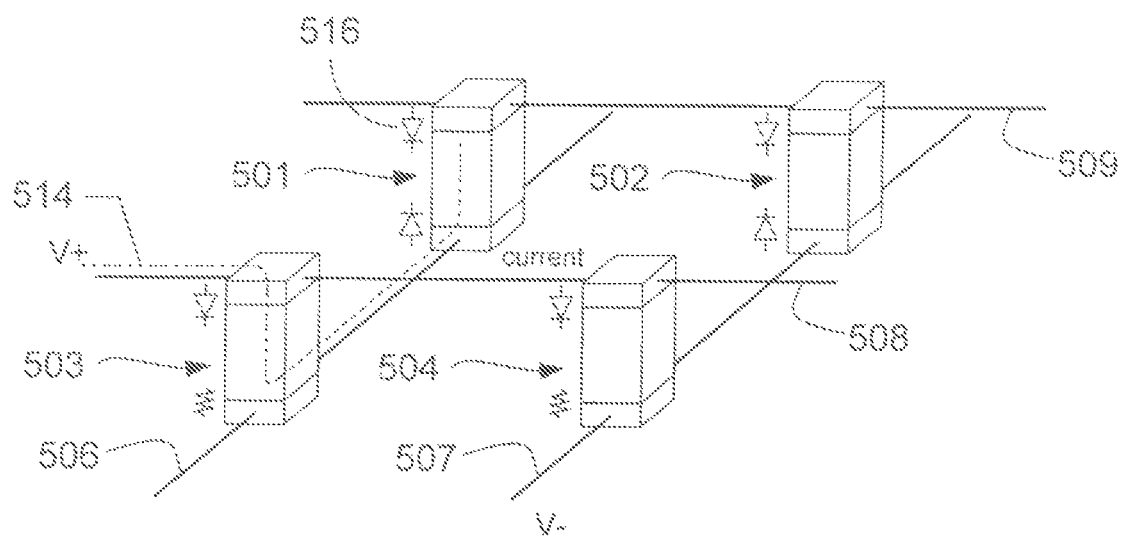

Incorporating crossbar junctions with the diode behavior described above with reference to FIG. 4 can prevent to some degree leakage currents. For example, as shown in the example of FIG. 5C, the crossbar junctions 501-504 include circuit symbols indicating two types of high and low-conductance states. The crossbar junctions 501 and 502 are both configured in a low-conductance state, as described above with reference to FIG. 4B, and crossbar junctions 503 and 504 are both configured in a high-conductance state, as described above with reference to FIG. 4A. In the example of FIG. 5C, a read voltage applied to the nanowires 508 and 507, as described above, creates a leakage current 514 that flows through crossbar junction 503 but cannot flow through crossbar junction 501 because of the diode 516. Current can flow in one direction from the first layer nanowires 508 and 509 to the second layer nanowires 506 and 507, but cannot flow from the second layer nanowires 506 and 507 to the first layer nanowires 508 and 509 because of the diodes located along the interfaces of the crossbar junctions with the first layer nanowires.

However, diode-like behavior at the interfaces breaks down when high reverse voltages associated with write voltages are applied across the junction elements. Diodes and diode-like interfaces have a characteristic reverse voltage at which the barrier to the flow of current breaks down. This characteristic reverse voltage is called the dielectric breakdown voltage. After the dielectric breakdown voltage is exceeded, the interface becomes permanently conductive and current can flow relatively unimpeded through the interface. In some embodiments, the interface may alternatively be changed by the application of a high reverse voltage. The term "breakdown voltage" as used herein refers to irreversible chemical changes at an interface rather than a reversible breakdown mechanisms, such as those used in avalanche or Zener diodes. A dielectric breakdown in the forward direction may occur when the electric field is relatively small, but the current and heating are great enough to chemically alter the interface.

In some circumstances, a high write voltage which is applied to induce drift in the mobile dopants may approach a diode breakdown voltage. High write voltages move the mobile dopants quickly and repeatedly into the desired position within the active region, as described above with reference to FIGS. 3A-3B. For example, the mobility of the dopants within the active region may be exponentially dependent on the magnitude of the applied write voltage. When high write voltages are applied, the drift of some dopants can be extremely rapid and repeatable. As a result, it can be desirable to use high programming voltages to achieve fast write times and accurate junction states. However, if the write voltage approaches a breakdown at an interface, the Schottky-like barriers in one or more of the crossbar junction interfaces may breakdown, allowing a surge of current to pass through the crossbar junction. This is undesirable for several reasons. First, the excess flow of current increases power consumption of the device. Second, the surge of voltage can induce heating in junctions or nanowires within the crossbar array. This excess heat can damage one or more of the components within the crossbar array. For example, the heat may cause chemical changes in the wires or active region resulting in undesirably properties. Higher heats may cause one or more of the components to melt, creating an electrical short. Consequently, the desire for high write voltages can be balanced against the possibility of breaking down the diode-like interfaces within the switchable crossbar junctions.

Figure 6A:
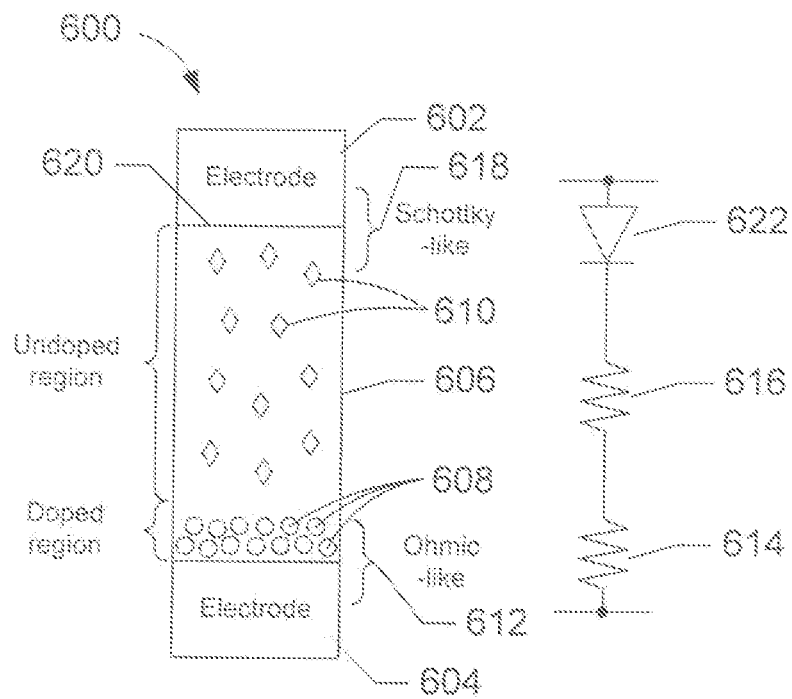
FIGS. 6A-6D show snapshots of switching a two-terminal device configured with a fast drift ionic species in accordance with one or more embodiments of the present invention.

In general, breakdown at the Schottky-like barrier interfaces in switching from a two-terminal device from a high-conductance state to a low-conductance state can be prevented by introducing fast drift ionic species to the active region of the two-terminal device. FIGS. 6A-6D show snapshots of switching a two-terminal device from a high-conductance state to a low-conductance state where the two-terminal device is configured with a fast drift ionic species to protect diode-like interfaces from breakdown. FIG. 6A shows a first snapshot of a two-terminal device 600 in a high-conductance state. The device 600 includes first electrodes 602, a second electrode 604, and an active region 606 disposed between the electrodes 602 and 604. The active region 606 includes a mobile dopant 608 located in close proximity to the electrode 604 and includes a fast drift ionic species 610 distributed throughout the active region 606 matrix. The dopants 608 and the fast drift species 610 have the same charge. For example, the dopants 608 and the fast drift species 610 can both be positively charged. FIG. 6A also includes a circuit diagram with a Ohmic-like barrier 612 characterized as a resistor 614, the undoped region characterized as a resistor 616, and a Schottky-like barrier 618 at interface 620 characterized as a diode 622. The mobile dopants 608 are fixed when a read voltage is applied to the electrodes 602 and 604. The read voltage corresponds to operating the electrode 602 as an anode and the electrode 604 as a cathode creating a forward bias across the Schottky-like barrier 618 at the interface 620. As a result, electron current flows from the electrode 602 through the Schottky-like barrier 618, the active region 606, and the Ohmic-like barrier 612 and out through the electrode 604.

Figure 6B:
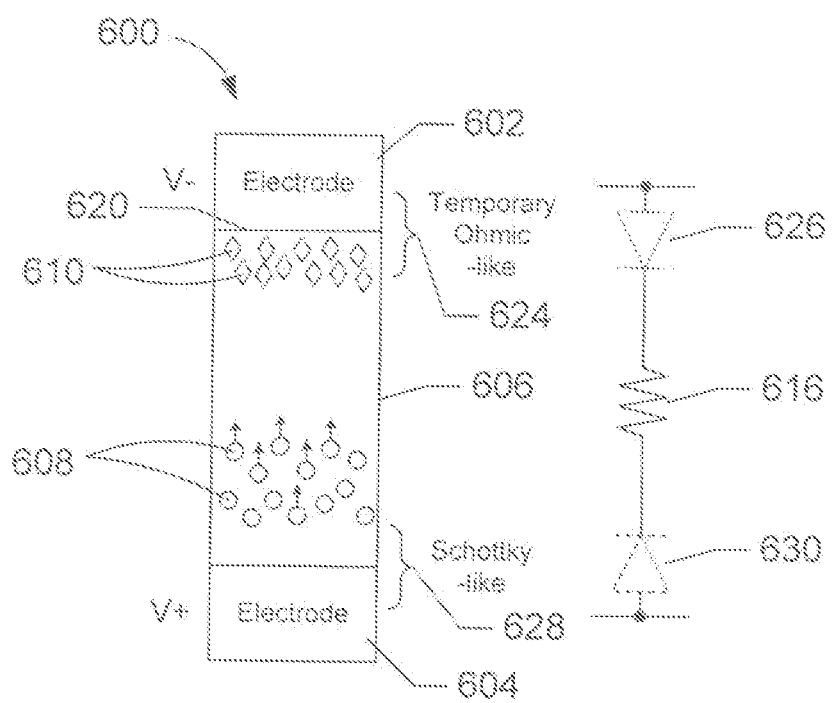

In order to switch the device 600 into a low-conductance state, a write voltage is applied to the device 600. FIG. 6B shows a second snapshot of the device 600 under a write voltage. The write voltage can be a voltage pulse comprising a positive voltage applied to the electrode 604 and/or a negative voltage applied to the electrode 602. The fast drift species 610 is selected to have a higher mobility in the active region 606 material than the mobile dopant 608. In other words, the fast drift species 610 has a faster drift rate than the drift rate of the mobile dopants 608. As shown in the example of FIG. 6B, the write voltage causes the positively charged fast drift species 610 to rapidly drift to the interface 620 temporarily switching the Schottky-like barrier 618, shown in FIG. 6A, at the interface 620 into an Ohmic-like barrier 624 represented by dotted-line diode 626. The snapshot of FIG. 6B also shows the slower drifting mobile dopants 608 beginning to drift away from the electrode 604 causing the Ohmic-like barrier 612, shown in FIG. 6A, to transition into a Schottky-like barrier 628, as indicated by dashed-line diode 630. The fast drift species located along the interface 620 creates a temporary conductive interface 620 allowing electron current created by the write voltage to temporally flow into the active region 606 effectively preventing diode breakdown along the interface 620. In other words, if the magnitude of the write voltage is large enough to constitute a breakdown voltage, the fast drift species 610 rapidly drifting into the region of the active region 606 adjacent to the interface 620 prevents breakdown by creating the temporary Ohmic-like barrier 624 that allows electron current to temporarily flow through the interface 620 while the write voltage is being applied.

Figure 6C:
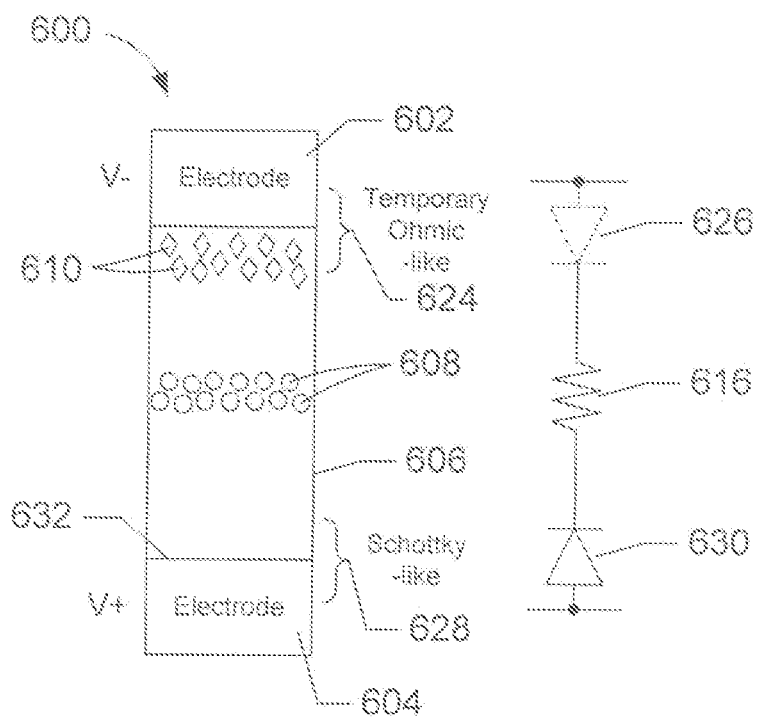

FIG. 6C shows a third snapshot of the device 600 under the write voltage. As shown in FIG. 6C, the duration of the write voltage is applied long enough to ensure that the dopants 608 drift into the approximate central region of the active region 606. As a result, a Schottky-like barrier 628 forms along the interface 632 as represented by diode 630. While the write voltage is still in effect, the fast drift species 610 remains near the interface 620 maintaining the temporary low resistance Ohmic-like barrier 624.

Figure 6D:
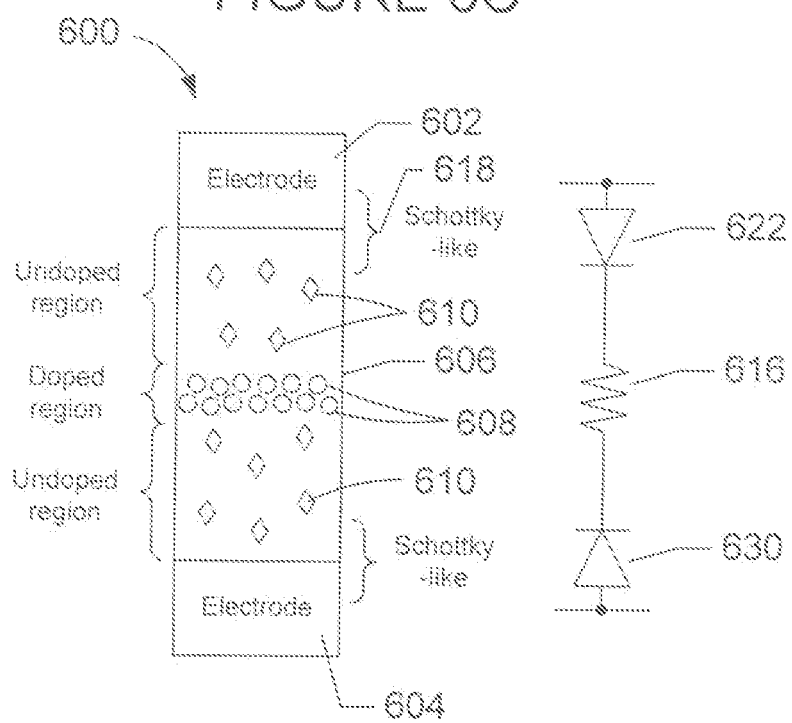

FIG. 6D shows a fourth snapshot of the device 600 in a low-conductance state after the write voltage has been removed. Because the fast drift species can diffuse within the active region 606, when the write voltage is removed the fast drift species diffuses into the undoped regions of the active region 606 restoring the Schottky-like barrier 618.

Embodiments of the present invention are limited to the mobile dopants 608 and the fast drift species 610 have a positive charge. In other embodiments, the dopants 608 and the fast drift species 610 can both be negatively charged and are attracted to positive charges and repelled by negative charges.

V. Two-Terminal Device Composition

Various compositions of crossbar junctions configured in accordance with embodiments of the present invention are now described with reference to FIG. 6. The active region 606 can be composed of an elemental and/or compound semiconductor. Elemental semiconductors include silicon (Si), germanium (Ge), and diamond (C). Compound semiconductors include group IV compound semiconductors, III-V compound semiconductors, and II-VI compound semiconductors. Group IV compound semiconductors include combinations of elemental semiconductors, such as SiC and SiGe. III-V compound semiconductors are composed of column IIIa elements selected from boron (B), aluminum (Al), gallium (Ga), and indium (In) in combination with column Va elements selected from nitrogen (N), phosphorus (P), arsenic (As), and antimony (Sb). III-V compound semiconductors are classified according to the relative quantities of III and V elements. For example, binary compound semiconductors include, but are not limited to, BN, BP, BSb, AlP, AlAs, AlSb, GaAs, GaSb, GaP, InN, InP, InAs, and InSb. Ternary compound semiconductors include, but are not limited to, InGaP, AlInAs, GaAsN, AlGaN, AlGaP, InGaN, and InAsSb. Ternary compound semiconductors also include varying quantities of elements, such as $GaAs_yP_{1-y}$ and $In_yGa_{1-y}As$, where y ranges from greater than 0 to less than 1. Quaternary compound semiconductors include, but are not limited to, AlGaInP, InAlGaP, InGaAlP, AlInGaP, AlGaAsN, InAlAsN. Quaternary compound semiconductors also include varying quantities of elements, such as $In_xGa_{1-x}As_yP_{1-y}$, where both x and y independently range from greater than 0 to less than 1. Quinary compound semiconductors include, but are not limited to, GaInNAsSb and GaInAsSbP. II-VI semiconductors are composed of column IIb elements selected from zinc (Zn), cadmium (Cd), mercury (Hg) in combination with column VIa elements selected from oxygen (O), sulfur (S), selenium (Se), and tellurium (Te). For example, binary II-VI semiconductors include, but are not limited to, CdSe, CdS, CdTe, ZnSe, ZnS, and ZnO.

The active region 606 can be composed of other types of suitable compound semiconductors including II-VI ternary alloy semiconductors, such as CdZnTe, HgCdTe, and HgZnSel; IV-VI compound semiconductors, such as PbSe, PbS, SnS, and SnTe; and IV-VI ternary compound semiconductors, such as PbSnTe, $Tl_2SnTe_5$, $Tl_2GeTe_5$. The active region 606 can also be composed of a II-V compound semiconductor including, but not limited to, $Cd_3P_2$, $Cd_3As_2$, $Zn_3P_2$, $Zn_3As_2$, and $Zn_3Sb_2$, and other compound semiconductors, such as $Pb_2I$, $MoS_2$, GaSe, SnS, $Bi_2S_3$, PtSi, and $BiI_3$. Semiconductor compounds consisting of some noble metal elements with a high mobility at room temperature, such as Ag, Cu, Au are especially interesting. The active region 606 can also be composed of a semiconducting nitride or a semiconducting halide. For example, semiconducting nitrides include AlN, GaN, ScN, YN, LaN, rare earth nitrides, alloys of these compounds, and more complex mixed metal nitrides, and semiconducting halides include CuCl; CuBr, and AgCl.

In other embodiments, the active region 606 can also be a mixture of the different compound semiconductors described above.

The mobile dopant 608 can be an anion vacancy or an aliovalent element. In other embodiments, the dopants can be p-type impurities, which are atoms that introduce vacant electronic energy levels called "holes" to the electronic band gaps of the active region. These dopants are also called "electron acceptors." In still other embodiments, the dopants can be n-type impurities, which are atoms that introduce filled electronic energy levels to the electronic band gap of the active region. These dopants are called "electron donors." For example, boron (B), Al, and Ga are p-type dopants that introduce vacant electronic energy levels near the valence band of the elemental semiconductors Si and Ge; and P, As, and Sb are n-type dopants that introduce filled electronic energy levels near the conduction band of the elemental semiconductors Si and Ge. In III-V compound semiconductors, column VI elements substitute for column V atoms in the III-V lattice and serve as n-type dopants, and column II elements substitute for column III atoms in the III-V lattice to form p-type dopants.

In other embodiments, the active region 606 can be composed of oxides that contain at least one oxygen atom (O) and at least one other element. In particular, the active region 102 can be composed of titania ($TiO_2$), zirconia ($ZrO_2$), and hafnia ($HfO_2$). These materials are compatible with silicon (Si) integrated circuit technology because they do not create doping in the Si. Other embodiments for the active region 606 include alloys of these oxides in pairs or with all three of the elements Ti, Zr, and Hf present. For example, the active region 102 can be composed of $Ti_xZr_yHf_zO_2$, where $x+y+z=1$. Related compounds include titanates, zirconates, and hafnates. For example, titanates includes $ATiO_3$, where A represents one of the divalent elements strontium (Sr), barium (Ba) calcium (Ca), magnesium (Mg), zinc (Zn), and cadmium (Cd). In general, the active region 102 can be composed of $ABO_3$, where A represents a divalent element and B represents Ti, Zr, and Hf. The active region 102 can also be composed of alloys of these various compounds, such as $Ca_aSr_bBa_cTi_xZr_yHf_zO_3$, where $a+b+c=1$ and $x+y+z=1$. There are also a wide variety of other oxides of the transition and rare earth metals with different valences that may be used, both individually and as more complex compounds. In each case, the mobile dopant can be an oxygen vacancy or an aliovalent element doped into the active region 606. The oxygen vacancies effectively act as dopants 608 with one shallow and one deep energy level. Because even a relatively minor nonstoichiometry of about 0.1% oxygen vacancies in $TiO_{2-x}$ is approximately equivalent to $5 \times 10^{19}$ dopants/cm$^3$, modulating oxygen vacancy profiles have strong effect on electron transport.

In other embodiments, the active region 606 can be a sulfide or a selenide of the transition metals with some ionic bonding character, essentially the sulfide and selenide analogues of the oxides described above.

In other embodiments, the active region 606 can be a semiconducting nitride or a semiconducting halide. For example, semiconducting nitrides include AlN, GaN, ScN, YN, LaN, rare earth nitrides, and alloys of these compounds and more complex mixed metal nitrides, and semiconducting halides include CuCl, CuBr, and AgCl. The active region 606 can be a phosphide or an arsenide of various transition and rare earth metals. In all of these compounds, the mobile dopant can be an anion vacancy or an aliovalent element.

A variety of dopants can be used and are selected from a group consisting of alkaline earth cations, transition metal cations, rare earth cations, oxygen anions or vacancies, chalcogenide anions or vacancies, nitrogen anions or vacancies, pnictide anions or vacancies, or halide anions or vacancies.

TABLE

Exemplary List of Doped, Undoped, and Mobile Dopants Composing Compound Materials.

| Undoped | Doped | Mobile Dopant |
|---|---|---|
| $TiO_2$ | $TiO_{2-x}$ | Oxygen vacancies |
| $ZrO_2$ | $ZrO_{2-x}$ | Oxygen vacancies |
| $HfO_2$ | $HfO_{2-x}$ | Oxygen vacancies |
| $SrTiO_2$ | $SrTiO_{2-x}$ | Oxygen vacancies |
| GaN | $GaN_{1-x}$ | Nitrogen vacancies |
| CuCl | $CuCl_{1-x}$ | Chlorine vacancies |
| GaN | GaN:S | Sulfide ions |

The fast drift ionic species 610 is selected to have the same charge as the mobile dopant in the example shown here. When the mobile dopant 608 is positively charged, the fast drift species 610 is a positively charged ion. Positively charged fast drift ionic species include, but are not limited to, hydrogen ion ($H^+$), lithium ion ($Li^+$), sodium ion ($Na^+$), and potassium ion ($K^+$). When the mobile dopant 608 is negatively charged, the fast drift species 610 is a negatively charged ion. Negatively charged fast drift ionic species include, but are not limited to, fluorine ($F^-$) and chlorine ($Cl^-$). It may also be possible that opposite charges are selected for the fast drift ionic species and the mobile dopant in some cases.

In addition to the large variety of combinations of semiconductor materials and suitable dopants comprising the active region 606, the electrodes 602 and 604 can be composed of platinum (Pt), gold (Au), copper (Cu), tungsten (W), aluminum (Al) or any other suitable metal, metallic compound (e.g. some perovskites with or without dopants such as $BaTiO_3$ and $Ba_{1-x}La_xTiO_3PrCaMnO_3$) or semiconductor. The electrodes 602 and 604 can also be composed of metallic oxides or nitrides, such as $RuO_2$, $IrO_2$, TaN, WN, and TiN. The electrodes 602 and 604 can also be composed of any suitable combination of these materials. For example, in certain embodiments, the first electrode 602 can be composed of Pt, and the second electrode 604 can be composed Au. In other embodiments, the first electrode 602 can be composed of Cu, and the second electrode 604 can be composed of $IrO_2$. In still other embodiments, the first electrode 602 can be composed of a suitable semiconductor, and the second electrode 604 can be composed of Pt.

Figure 7:
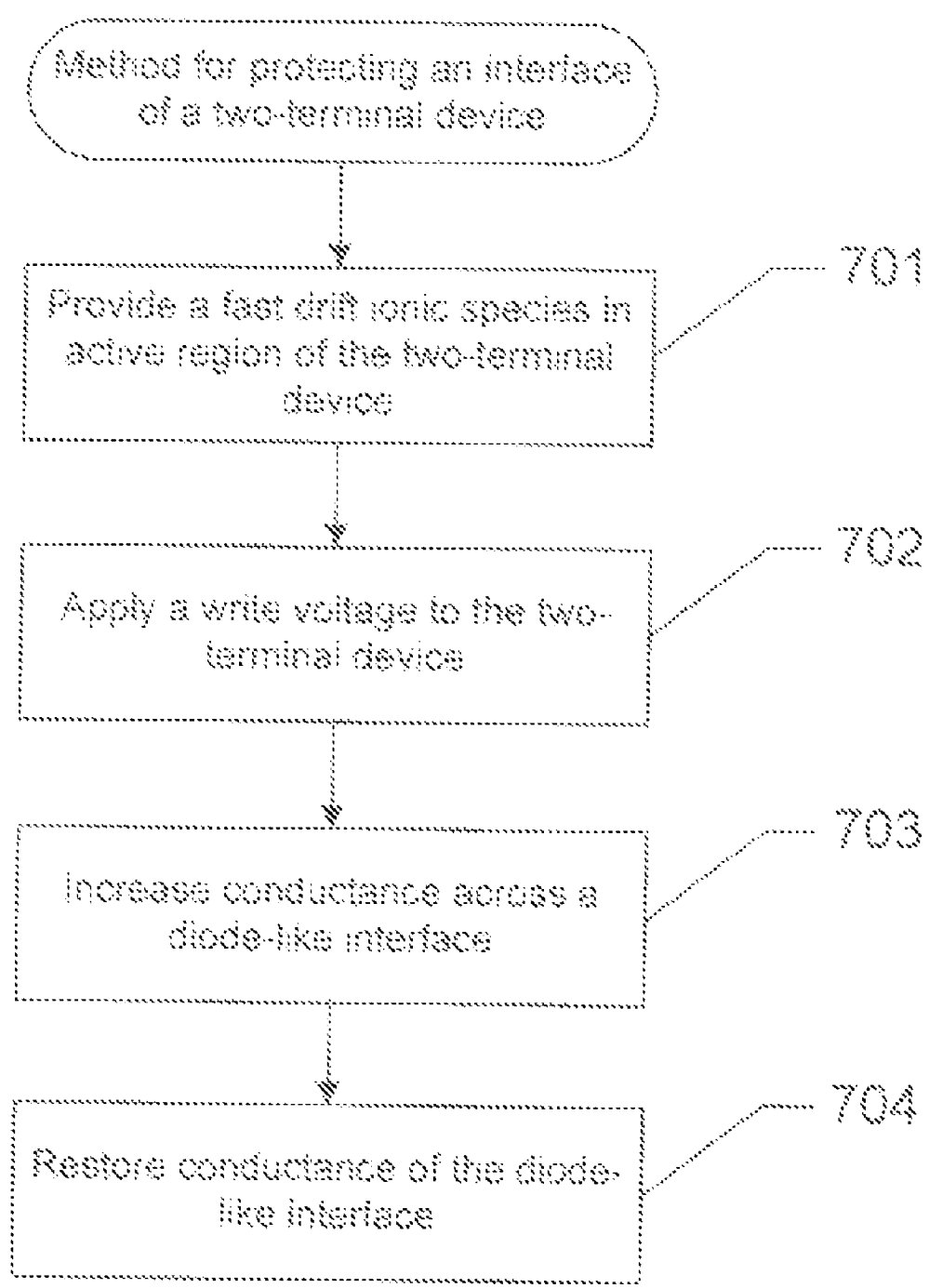
FIG. 7 shows a flow diagram of a method of protecting an interface of a two-terminal device in accordance with one or more embodiments of the present invention.

FIG. 7 shows a flow diagram of a method of protecting an interface of a two-terminal device. The two-terminal device has an active region disposed between a first electrode and a second electrode, as described above. In step 701, a fast drift ionic species is embedded within the active region during deposition of the active region, as described above. In step 702, a write voltage is applied to the first and second electrodes. In step 703, the write voltage temporarily increases conductance across a diode-like electrode/active region interface. The fast drift ionic species drifts into the diode-like electrode/active region under the influence of the write voltage. In step 704, the conductance state of the diode-like electronic/active region is restored when the write voltage is no longer applied.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

The invention claimed is:

1. A two-terminal device comprising:
   a first electrode;
   a second electrode; and
   an active region disposed between the first electrode and the second electrode, the active region including,
      a mobile dopant, and
      a fast drift ionic species, wherein the fast drift ionic species is to drift into an electrode/active region interface to temporarily increase conductance across the electrode/active region interface when a write voltage is applied to the two-terminal device to switch from a high-conductance state to a low-conductance state.

2. The device of claim 1, wherein the active region further comprises a memristive material.

3. The device of claim 1, wherein the mobile dopant and the fast drift ionic species further comprise a positive charge.

4. The device of claim 1, wherein the mobile dopant and the fast drift ionic species further comprise a negative charge.

5. The device of claim 1, wherein the mobile dopant is to drift within the active region under the influence of write voltage.

6. The device of claim 1, wherein the fast drift ionic species is to drift within the active region at a faster drift rate than the mobile dopant under the write voltage.

7. The device of claim 1, wherein the two-terminal device in the high-conductance state further comprises the mobile dopant positioned within the active region near one of two electrode/active region interfaces.

8. The device of claim 7, wherein the mobile dopant positioned near the electrode/active region interface is to operate as an Ohmic barrier.

9. The device of claim 1, wherein the fast drift ionic species is to form a temporary barrier that is to operate as an Ohmic barrier at the electrode/active region interface to temporarily increase conductance across the electrode/active region interface.

10. The device of claim 1, wherein the two-terminal device in the low-conductance state further comprises the mobile dopant positioned near the approximate center of the active region.

11. The device of claim 10, further comprising a first barrier that is to operate as a Schottky barrier formed at the first electrode/active region interface and a second barrier that is to operate as a Schottky barrier formed at the second electrode/active region interface, the first and second barriers having rectifying properties that are operated as a head-to-head diode.

12. The device of claim 1, wherein the fast drift ionic species is to diffuse within the active region when the write voltage is no longer applied to the two-terminal device.

13. A crossbar array comprising:
    a first layer of approximately parallel nanowires;
    a second layer of approximately parallel nanowires, each nanowire in the second layer forming a crossbar junction with each nanowire in the first layer, wherein each crossbar junction includes an active region, the active region including:
       a mobile dopant, and
       a fast drift ionic species, wherein the fast drift ionic species is to drift into an electrode/active region interface to temporarily increase conductance across the electrode/active region interface when a write voltage is applied to the two-terminal device to switch from a high-conductance state to a low-conductance state.

14. A method of protecting an interface of a two-terminal device, the two-terminal device having an active region disposed between a first electrode and a second electrode, the method comprising:
    embedding a mobile dopant within the active region;
    embedding a fast drift ionic species within the active region;
    applying a write voltage to the first and second electrodes;
    temporarily increasing conductance across an electrode/active region interface, wherein the fast drift ionic species drifts into the electrode/active region under the influence of the write voltage; and
    restoring the conductance state of the electronic/active region when the write voltage is no longer applied.

15. The method of claim 14, wherein the fast drift ionic species is to drift within the active region at a faster drift rate than the mobile dopant under the write voltage.

* * * * *